(12) United States Patent
Chen et al.

(10) Patent No.: US 7,944,729 B2
(45) Date of Patent: May 17, 2011

(54) SIMULTANEOUSLY WRITING MULTIPLE ADDRESSABLE BLOCKS OF USER DATA TO A RESISTIVE SENSE MEMORY CELL ARRAY

(75) Inventors: Yiran Chen, Eden Praire, MN (US); Daniel S. Reed, Maple Plain, MN (US); Yong Lu, Edina, MN (US); Harry Hongyue Liu, Maple Grove, MN (US); Hai Li, Eden Prairie, MN (US); Rod V. Bowman, Bloomington, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 227 days.

(21) Appl. No.: 12/360,931

(22) Filed: Jan. 28, 2009

(65) Prior Publication Data

US 2010/0188883 A1 Jul. 29, 2010

(51) Int. Cl.
*G11C 11/00* (2006.01)
(52) U.S. Cl. ......... 365/148; 365/156; 365/171; 365/173
(58) Field of Classification Search .................. 365/148, 365/100, 145, 157, 158, 171, 172, 173
See application file for complete search history.

(56) References Cited

U.S. PATENT DOCUMENTS

| 5,200,959 | A | 4/1993 | Gross et al. |
| 6,034,891 | A | 3/2000 | Norman |
| 6,940,742 | B2 * | 9/2005 | Yamamura ..................... 365/145 |
| 7,263,007 | B2 | 8/2007 | Kurosaki |
| 7,340,581 | B2 | 3/2008 | Gorobets et al. |
| 7,369,434 | B2 | 5/2008 | Radke |
| 7,646,629 | B2 * | 1/2010 | Hamberg et al. ............. 365/158 |
| 2010/0095057 | A1 * | 4/2010 | Li et al. .......................... 711/104 |
| 2010/0118587 | A1 * | 5/2010 | Chen et al. .................... 365/148 |
| 2010/0177551 | A1 * | 7/2010 | Chen et al. .................... 365/148 |

\* cited by examiner

*Primary Examiner* — Anh Phung
*Assistant Examiner* — Toan Le
(74) *Attorney, Agent, or Firm* — Fellers, Snider et al.

(57) ABSTRACT

Method and apparatus are disclosed for storing data to non-volatile resistive sense memory (RSM) memory cells of a semiconductor memory array, including but not limited to resistive random access memory (RRAM) and spin-torque transfer random access memory (STTRAM or STRAM) cells. In accordance with various embodiments, a plurality of addressable data blocks from a host device are stored in a buffer. At least a portion of each of the addressable data blocks are serially transferred to a separate register of a plurality of registers. The transferred portions of said addressable data blocks are thereafter simultaneously transferred from the registers to selected RSM cells of the array.

20 Claims, 6 Drawing Sheets

BIT WRITE OPERATION

BIT READ OPERATION

STRAM CELL

RRAM CELL

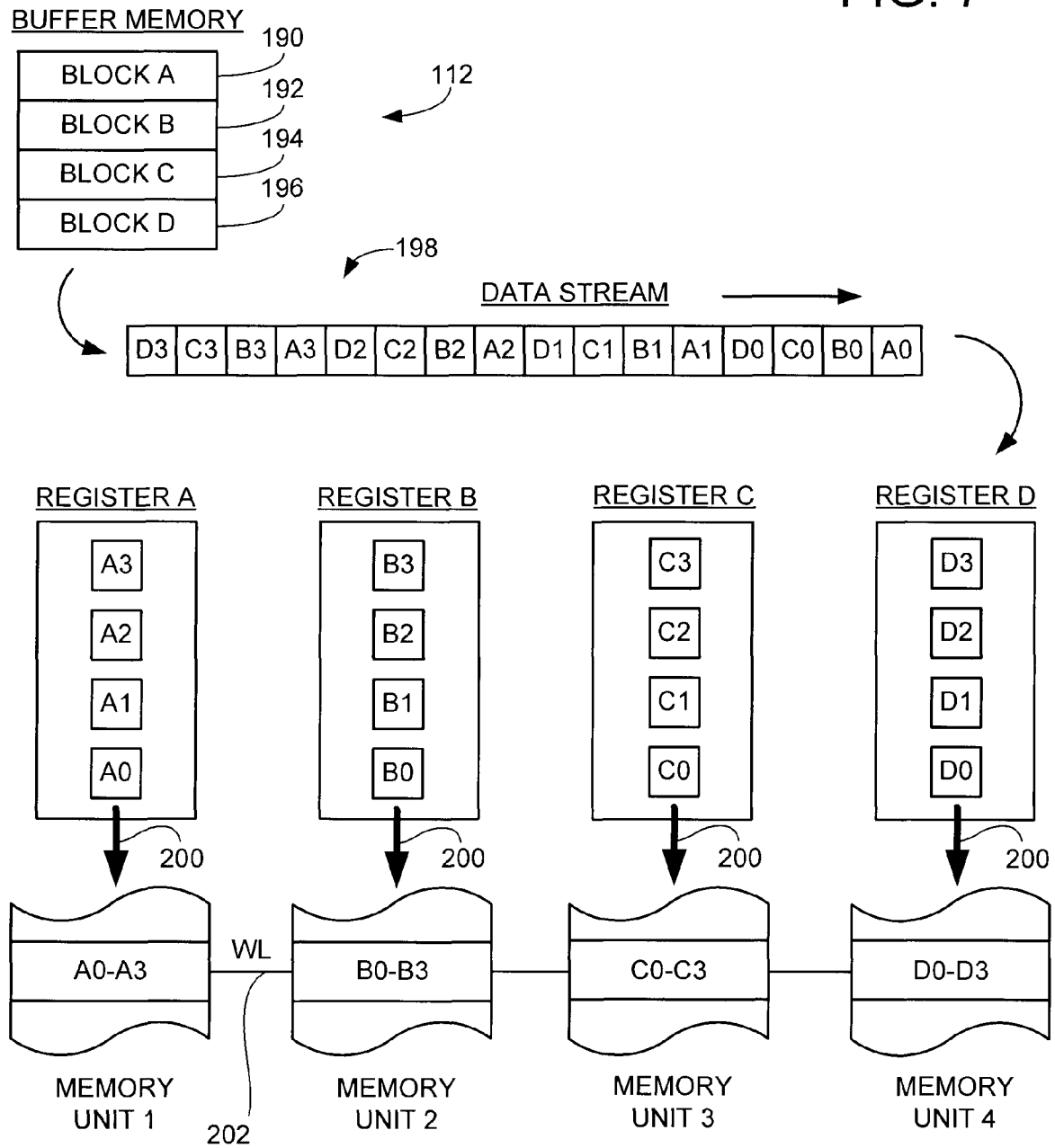

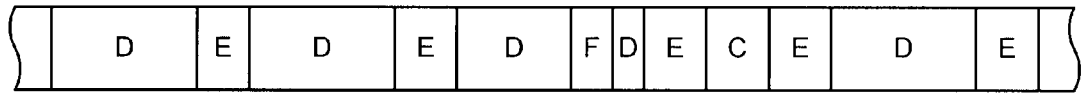
D=DATA
E=ECC
F=FILL
C=CONTROL
FIG. 11
DEFECT MANAGEMENT DATA
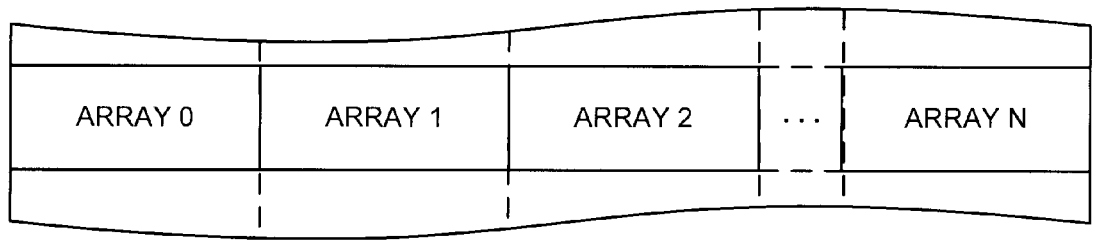
FIG. 12
ARRAY PARTITIONS
| BOOT | BOOT | BOOT | | BOOT |
|---|---|---|---|---|
| RESERVED 0 | RESERVED 1 | RESERVED 2 | | RESERVED N |
| CONTROL 0 | CONTROL 1 | CONTROL 2 | | CONTROL N |
| USER DATA | USER DATA | USER DATA | ... | USER DATA |
| SPARE 0 | SPARE 1 | SPARE 2 | | SPARE N |
FIG. 13

SIMULTANEOUSLY WRITING MULTIPLE ADDRESSABLE BLOCKS OF USER DATA TO A RESISTIVE SENSE MEMORY CELL ARRAY

BACKGROUND

Data storage devices generally operate to store and retrieve data in a fast and efficient manner. Some storage devices utilize a semiconductor array of solid-state memory cells to store individual bits of data. Such memory cells can be volatile or non-volatile. Volatile memory cells generally retain data stored in memory only so long as operational power continues to be supplied to the device. Non-volatile memory cells generally retain data stored in memory even in the absence of the application of operational power.

So-called resistive sense memory (RSM) cells can be configured to have different electrical resistances to store different logical states. The resistance of the cells can be subsequently detected during a read operation by applying a read current and sensing a signal in relation to a voltage drop across the cell. Exemplary types of RSM cells include resistive random access memory (RRAM), magnetic random access memory (MRAM), spin-torque transfer random access memory (STTRAM or STRAM), etc.

SUMMARY

Various embodiments of the present invention are generally directed to a method and apparatus for storing data to non-volatile resistive sense memory (RSM) memory cells of a semiconductor memory array, including but not limited to resistive random access memory (RRAM), magnetic random access memory (MRAM), or spin-torque transfer random access memory (STTRAM or STRAM) cells.

In accordance with some embodiments, a method generally comprises storing a plurality of addressable data blocks from a host device in a buffer; serially transferring at least a portion of each of the addressable data blocks to a separate register of a plurality of registers; and simultaneously writing the transferred portions of said addressable data blocks from the registers to non-volatile resistive sense memory (RSM) cells of a semiconductor memory array.

In accordance with other embodiments, an apparatus generally comprises a semiconductor memory array comprising a plurality of non-volatile resistive sense memory (RSM) cells; a buffer configured to store a plurality of addressable data blocks from a host device; and a controller configured to serially transfer at least a portion of each of the addressable data blocks to a separate register of a plurality of registers, and to simultaneously write the transferred portions of said addressable data blocks from the registers to corresponding RSM cells of said array.

These and various other features and advantages which characterize the various embodiments of the present invention can be understood in view of the following detailed discussion in view of the accompanying drawings.

BRIEF DESCRIPTION OF THE DRAWINGS

FIG. 7 provides an exemplary format for an addressable sector format useful in accordance with various embodiments.

FIG. 8 sets forth a functional flow diagram to illustrate an exemplary data write operation in accordance with various embodiments.

FIG. 11 illustrates an interleaved serial transfer stream generated in accordance with various embodiments.

FIG. 12 provides a manner in which defect management data may be stored in memory.

FIG. 13 provides a manner in which array partitions may be formed.

DETAILED DESCRIPTION

Figure 1:
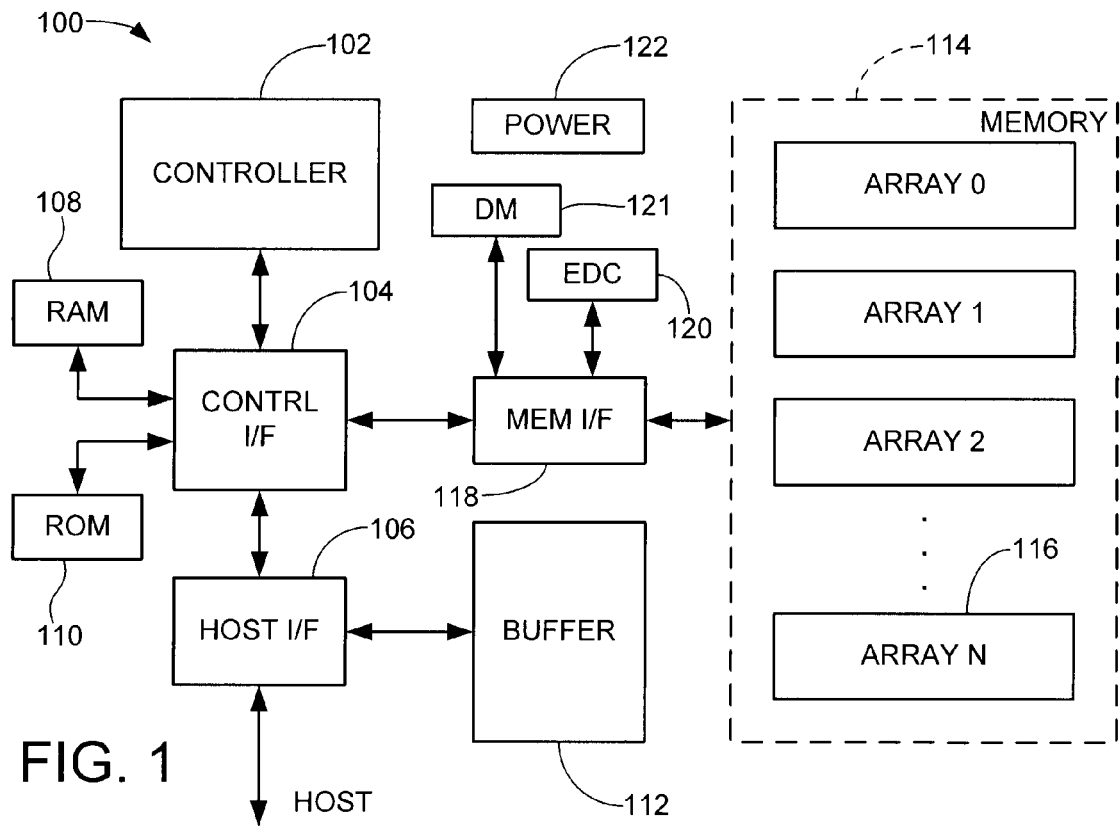
FIG. 1 is a generalized functional representation of an exemplary data storage device constructed and operated in accordance with various embodiments of the present invention.

FIG. 1 provides a functional block representation of a data storage device 100 constructed and operated in accordance with various embodiments of the present invention. The data storage device is contemplated as comprising a portable non-volatile memory storage device such as a PCMCIA card or USB-style external memory device. It will be appreciated, however, that such characterization of the device 100 is merely for purposes of illustration and is not limiting to the claimed subject matter.

Top level control of the device 100 is carried out by a suitable controller 102, which may be a programmable or hardware-based microcontroller. The controller 102 communicates with a host device via a controller interface (I/F) circuit 104 and a host I/F circuit 106. Local storage of requisite commands, programming, operational data, etc. is provided via random access memory (RAM) 108 and read-only memory (ROM) 110. A buffer 112 serves to temporarily store input write data from the host device and readback data pending transfer to the host device, as well as to facilitate serialization/deserialization of the data during a transfer operation. The buffer can be located in any suitable location, including in a portion of the array 114.

A memory space is shown at 114 to comprise a number of memory arrays 116 (denoted Array 0-N), although it will be appreciated that a single array can be utilized as desired. Each array 116 preferably comprises a block of semiconductor memory of selected storage capacity. Communications between the controller 102 and the memory space 114 are coordinated via a memory (MEM) I/F 118. As desired, on-the-fly error detection and correction (EDC) encoding and decoding operations are carried out during data transfers by way of an EDC block 120, and defect management (DM) functions are carried out by block 121.

While not limiting, in an embodiment the various circuits depicted in FIG. 1 are arranged as a single chip or chip set formed on one or more semiconductor dies with suitable encapsulation, housing and interconnection features (not separately shown for purposes of clarity). Input power to operate the device is handled by a suitable power management circuit 122 and is supplied from a suitable source such as from a battery, AC power input, etc. Power can also be supplied to the device 100 directly from the host such as through the use of a USB-style interface, etc.

Any number of data storage and transfer protocols can be utilized, such as logical block addressing (LBAs) whereby data are arranged and stored in fixed-size blocks (such as 512 bytes of user data plus overhead bytes for ECC, sparing, header information, etc). Host commands can be issued in terms of LBAs, and the device 100 can carry out a corresponding LBA-to-PBA (physical block address) conversion to identify and service the associated locations at which the data are to be stored or retrieved. These and other features will be discussed in detail below.

Figure 2:
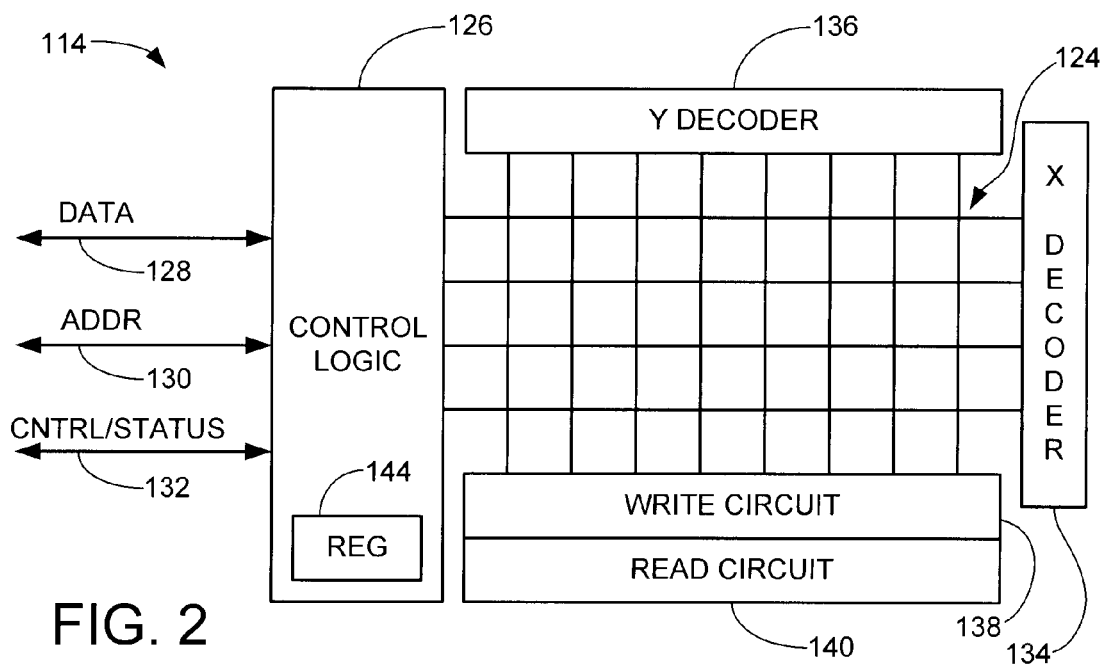
FIG. 2 shows circuitry used to read data from and write data to a memory array of the device of FIG. 1.

FIG. 2 provides a generalized representation of selected aspects of the memory space 114 of FIG. 1. Data are stored in each array as an arrangement of rows and columns of memory cells 124, accessible by various row (word) and column (bit) lines, etc. The actual configurations of the cells and the access lines thereto will depend on the requirements of a given application. Generally, however, it will be appreciated that various other control lines will generally include enable lines that selectively enable and disable the respective writing and reading of the value(s) of the individual cells.

Control logic 126 receives and transfers data, addressing information and control/status values along multi-line bus paths 128, 130 and 132, respectively. X and Y decoding circuitry 134, 136 provide appropriate switching and other functions to access the appropriate cells 124. As desired, adjacent arrays can be configured to share a single Y (row) decoder 136 to reduce RC delay effects along an associated word line.

A write circuit 138 represents circuitry elements that operate to carry out write operations to write data to the cells 124, and a read circuit 140 correspondingly operates to obtain readback data from the cells 124. Local buffering of transferred data and other values can be provided via one or more local registers 144. At this point it will be appreciated that the circuitry of FIG. 2 is merely exemplary in nature, and any number of alternative configurations can readily be employed as desired depending on the requirements of a given application.

The memory cells 124 are characterized as so-called resistive sense memory (RSM) cells. As used herein, RSM cells are generally described as cells configured to have different electrical resistances which are used to store different logical states. The resistance of the cells can be subsequently detected during a read operation by applying a read current and sensing a signal in relation to a voltage drop across the cell. Exemplary types of RSM cells include resistive random access memory (RRAM), magnetic random access memory (MRAM), spin-torque transfer random access memory (STTRAM or STRAM), etc.

Advantages of RSM cells over other types of non-volatile memory cells such as EEPROM and flash include the fact that no floating gate is provided in the cell construction. No erase operation is necessary prior to the writing of new data to an existing set of cells. Rather, RSM cells can be individually accessed and written to any desired logical state (e.g., a "0" or "1") irrespective of the existing state of the RSM cell. Also, write and read power consumption requirements are substantially reduced, significantly faster write and read times can be achieved, and substantially no wear degradation is observed as compared to erasable cells, which have a limited write/erase cycle life.

Figure 3:
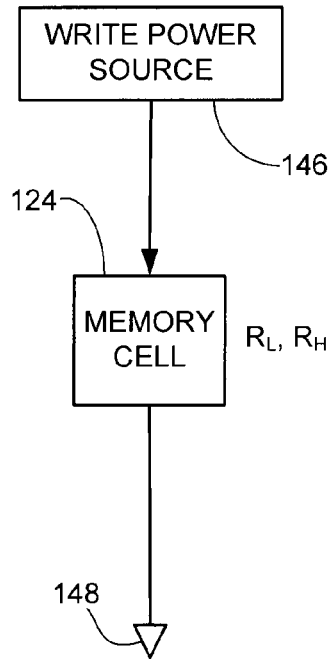
FIG. 3 generally illustrates a manner in which data may be written to a memory cell of the memory array.

Data are written to the respective RSM memory cells 124 as generally depicted in FIG. 3. Generally, a write power source 146 applies the necessary input (such as in the form of current, voltage, magnetization, etc.) to configure the memory cell 124 to a desired state. It can be appreciated that FIG. 3 is merely a representative illustration of a bit write operation.

The configuration of the write power source 146, memory cell 124, and reference node 148 can be suitably manipulated to allow the writing of data to the array. Depending on the orientation of the applied power, the cell 124 may take either a relatively low resistance ($R_L$) or a relatively high resistance ($R_H$), While not limiting, exemplary $R_L$ values may be in the range of about 100 ohms ($\Omega$) or so, whereas exemplary $R_H$ values may be in the range of about 100K$\Omega$ or so. These values are retained by the respective cells until such time that the state is changed by a subsequent write operation. While not limiting, in the present example it is contemplated that a high resistance value ($R_H$) denotes storage of a logical 1 by the cell 124, and a low resistance value ($R_L$) denotes storage of a logical 0.

Figure 4:
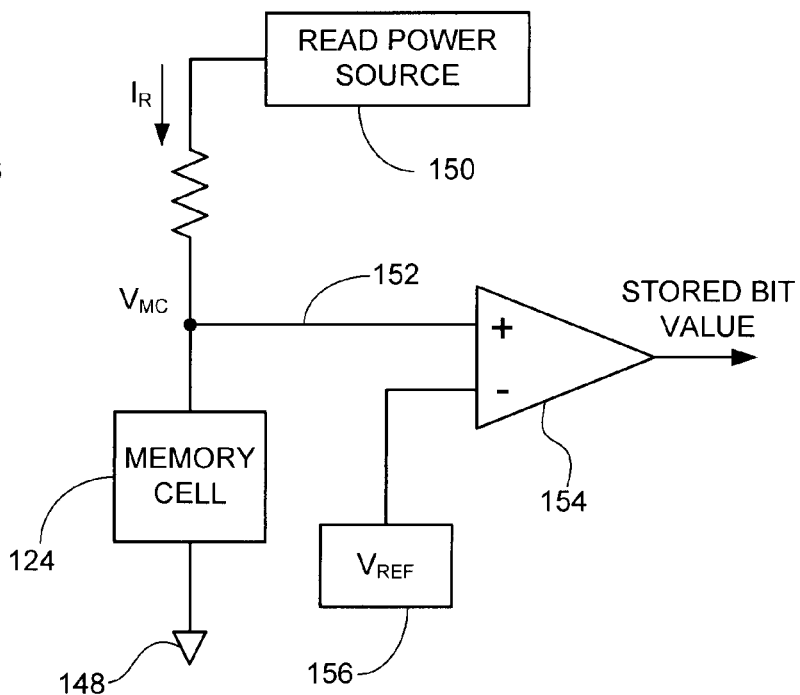
FIG. 4 generally illustrates a manner in which data may be read from the memory cell of FIG. 3.

The logical bit value(s) stored by each cell 124 can be determined in a manner such as illustrated by FIG. 4. A read power source 150 applies an appropriate input (e.g., a selected read voltage) to the memory cell 124. The amount of read current $I_R$ that flows through the cell 124 will be a function of the resistance of the cell ($R_L$ or $R_H$, respectively). In the case of STRAM, as well as other types of memory configurations such as RRAM, the read current magnitude will generally be significantly lower than the write current magnitude utilized to set the storage state of the bit. The voltage drop across the memory cell (voltage $V_{MC}$) is sensed via path 152 by the positive (+) input of a comparator 154. A suitable reference (such as voltage reference $V_{REF}$) is supplied to the negative (−) input of the comparator 154 from a reference source 156.

The reference voltage $V_{REF}$ is preferably selected such that the voltage drop $V_{MC}$ across the memory cell 124 will be lower than the $V_{REF}$ value when the resistance of the cell is set to $R_L$, and will be higher than the $V_{REF}$ value when the resistance of the cell is set to $R_H$. In this way, the output voltage level of the comparator 154 will indicate the logical bit value (0 or 1) stored by the memory cell 124. The reference voltage can be generated and supplied externally, or can be generated locally using dummy reference cells or a self-reference operation, as desired.

Figure 5:
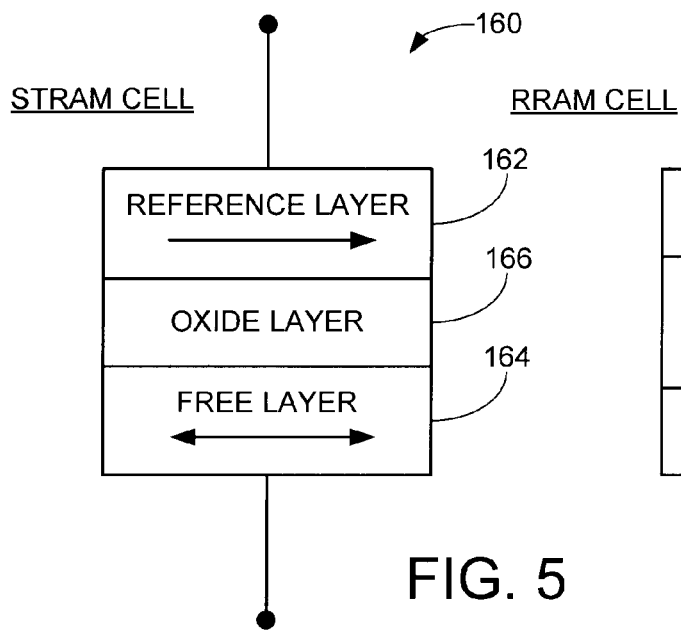
FIG. 5 shows an exemplary construction of a resistive sense memory (RSM) cell characterized as a spin-torque transfer random access memory (STTRAM or STRAM) cell.

FIG. 5 generally illustrates a magnetic tunneling junction (MTJ) 160 of a selected one of the RSM memory cells 124, characterized as an STRAM memory cell. The MTJ includes two ferromagnetic layers 162, 164 separated by an oxide barrier layer 166 (such as magnesium oxide, MgO). The resistance of the MTJ 160 is determined in relation to the relative magnetization directions of the ferromagnetic layers 162, 164: when the magnetization is in the same direction (see FIG. 5A), the MTJ is in the low resistance state ($R_L$); when the magnetization is in opposite directions (see FIG. 5B), the MTJ is in the high resistance state ($R_H$).

In some embodiments, the magnetization direction of the reference layer 162 is fixed by coupling to a pinned magnetization layer (e.g., a permanent magnet, etc.), and the magnetization direction of the free layer 164 can be changed by passing a driving current polarized by magnetization in the reference layer 162. To read the logic state stored by the MTJ 160, a relatively small current is passed through the MTJ between a source line (SL) and a bit line (BL). Because of the difference between the low and high resistances of the MTJ in the respective logical 0 and 1 states, the voltage at the bit line will be different, and this is sensed as set forth above in FIG. 4.

Figure 6:
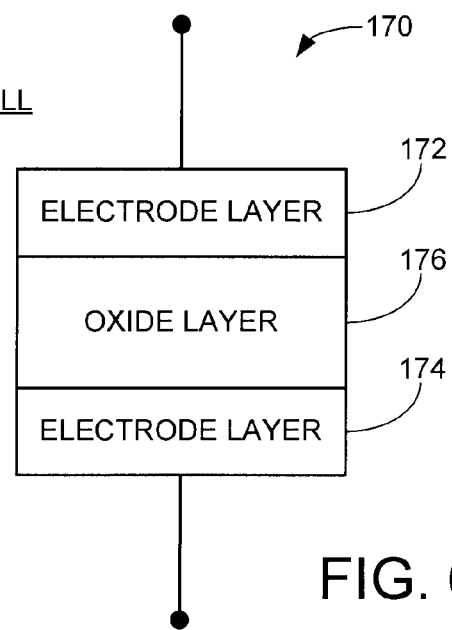
FIG. 6 shows an exemplary construction of a resistive sense memory (RSM) cell characterized as a resistive random access memory (RRAM) cell.

FIG. 6 generally illustrates an alternative embodiment of the RSM cells 124 in which an RRAM construction is used. An RRAM cell 170 includes opposing electrode layers 172, 174 and an oxide layer 176. The oxide layer 176 may be configured to have a nominally high resistance (e.g., $R_H$). The resistance of the oxide layer, however, can be lowered (e.g., $R_L$) through application of a relatively high write voltage across the RRAM cell 170. Such voltage generates lower resistance paths (filaments) as components of a selected electrode layer 172, 174 migrate into the oxide layer 176.

The oxide layer 176 can be restored to its original, higher resistance through application of a corresponding voltage of opposite polarity. As with the MTJ 160 of FIG. 6, the storage state of the RRAM cell 170 of FIG. 7 can be read by passing a read current from a source line (SL) to a bit line (BL), and sensing the resistance of the cell in a manner such as shown in FIG. 4.

In some embodiments, each RSM memory cell 124 stores a single logical bit value (e.g., 0 or 1) in relation to the resistive state of the associated cell. In other embodiments, each memory cell 124 is configured to store multiple bits. For example, a memory cell configured to provide four different statuses (e.g., four different resistance levels R0 to R3), this cell can be used to store two bits (e.g., R0=00; R1=01; R2=10; R3=11). More generally, if a memory cell can store $2^N$ different statuses, it can be used to store up to N bits. For clarity of illustration, the following discussion will contemplate the use of single-bit storage configuration for the memory cells 124, and modifications to accommodate multi-bit storage configurations will readily occur to the skilled artisan in view thereof.

In some embodiments, a memory sector structure is utilized such as shown at 180 in FIG. 7. The sector 180 corresponds to addressable physical partitions of memory cells 124 in the array. Each sector generally includes a user data field 182, an error correction code (ECC) field 184, a spare field 186, and a header field 188. Other arrangements, including arrangements with fewer fields or additional fields, are readily contemplated. In some embodiments, each memory array 116 (see FIGS. 1-2) is arranged to have a width corresponding to this format so that a separate sector 180 extends along each row (word line). In other embodiments, each sector 180 is allocated independently of word line, and may be distributed into separate portions of the array as convenient, including separate portions of different or arbitrary size to maximize memory utilization and/or processing.

In some embodiments, the user data field 182 will store an amount of user data corresponding to an addressable block of user data from a host device, such as 512 bytes. The number of allocated ECC bytes of field 184 will depend on the utilized error correction scheme (e.g., Reed Solomon codes, parity codes, etc.), and may be on the order of a few bytes. The number of allocated spare bytes of field 186 will similarly be selected in relation to the requirements of a given application, and may also be on the order of a few bytes. The header information in field 188 can provide any suitable addressing or other control information associated with the sector 180, including information as to where various portions of the sector are stored. This information can alternatively be stored in a separate overhead control data table in the array.

Data are written to the array(s) 116 in a manner such as illustrated in FIG. 8. Generally, a plurality of addressable data blocks from the host device are stored in the buffer 112, such as such as blocks A-D 190, 192, 194 and 196. A serial transfer operation takes place to generate an interleaved, serialized transfer stream 198 made up of interleaved portions of the blocks 190, 192, 194 and 196. For example, block A 190 is divided into portions A0-A3, block B 192 is divided into portions B0-B3, and so on. At least one portion of each of the addressable blocks is transferred to a separate register, such as registers A-D.

A simultaneous write operation next occurs, as indicated by parallel transfer streams 200, during which the transferred portions of the addressable data blocks 190, 192, 194, 196 in the registers A-D are simultaneously written to separate groups of the RSM memory cells 124 in one or more of the arrays 116.

In some embodiments, this writing can comprise a read back of the existing memory states in the affected cells 124, and only writing those cells in which the updated memory states are different, such as through the use of an exclusive-or (XOR) comparison of the read back and write data. In other embodiments, this writing can comprise the overwriting of every memory cell irrespective of its previous state. As noted above, at least certain types of RSM cell constructions advantageously facilitate the simultaneous writing of both "0s" and "1s" to different cells in the same block and along the same word line, significantly reducing the time required to write data to the array.

No prior erase operation is necessary in order to carry out the simultaneous writing operation. Moreover, while FIG. 8 shows the simultaneous writing operation as being carried out to cells along a common word line (WL) 202, such is merely for illustration since the data can be alternatively written to any number of different locations in the array(s) 116 along any number of different word lines.

It will be appreciated that the interleaved transfer of the various portions of the addressable blocks 190, 192, 194, 196 advantageously facilitates the simultaneous writing of multiple blocks from the host. Each portion (e.g., A0, etc.) can be the same size (e.g., 128 bytes) or of a different arbitrary size selected in relation to various factors, such as available physical memory space, read/write capabilities of the device 100, etc. It is contemplated that additional data, including ECC codes, control (overhead) data, defect management data, fill data, etc. may also be transferred in the serial transfer stream of FIG. 8, as explained below. The user data stored in FIG. 8 can be read back to the buffer 112 for subsequent transfer using a similar process in which the respective portions are simultaneously read from the array(s) 116 and serially transferred to the input buffer 112 for subsequent transfer to the host.

In another embodiment, the interleaved data transfer results in different sets of data from different blocks being stored together in the same register. For example, with reference again to FIG. 8, the portions A0, B0, C0 and D0 can be alternatively characterized as portions of the data block A 190, etc., in which case the data are transferred to the respective registers and interleaved in the array 116. This can be useful, for example, when a larger ECC block structure is desired. In other embodiments, the addressable blocks can be organized in individual memory units. However, the location of memory blocks as shown in FIG. 8 is not limiting as the blocks can be organized in various orientations.

Figure 9:
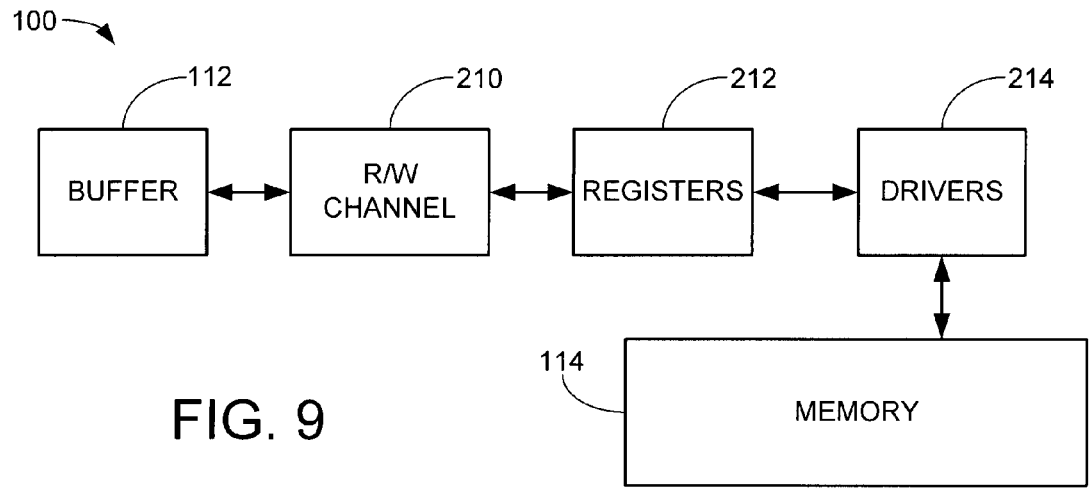
FIG. 9 illustrates a functional block diagram of the device of FIG. 1 during an exemplary data write operation in accordance with various embodiments.

FIG. 9 provides a generalized functional block diagram of the device 100 to further illustrate the foregoing operations. It will be appreciated that the various operations in FIG. 9 are carried out under the control of the controller 102 (FIG. 1), and aspects of FIG. 9 may be realized either in the controller programming or firmware, or realized as separate circuit elements coupled to the controller 102.

A read/write (R/W) channel block 210 represents portions of the device 100 that operate to serialize and encode the input data from buffer 112. A register block 212 receives the serialized, interleaved data from the R/W channel block 210, and collectively represents multiple registers such as the parallel registers A-D of FIG. 8. Drivers block 214 represents the associated read/write drivers, verification circuitry and local registers or other buffers used in the transferring of data to and from the associated array 116.

Figure 10:
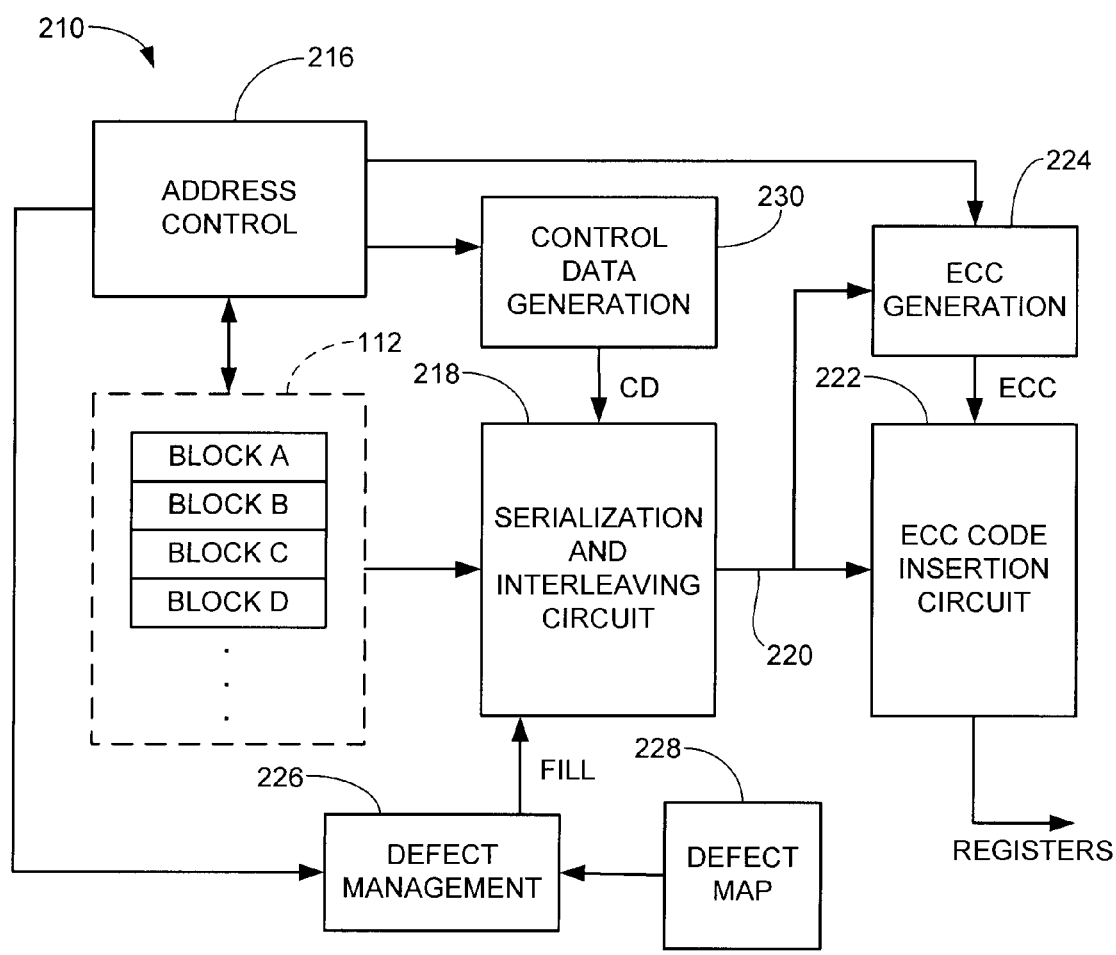
FIG. 10 sets forth a representation of read channel portions of FIG. 9.

Aspects of the R/W channel block 210 are set forth in FIG. 10. Generally, an address control block 216 addresses the buffer 112 and initiates an output of data (in 8 bit bytes) from a first selected one of the host supplied data blocks. A serialization and interleave circuit 218, such as a multiplexer, continues to pass a selected number of bytes from the selected data block until receiving a selection change signal from the addressing block 216, in which case the circuit 218 begins streaming bytes of data from the next selected data block in the buffer 112.

This processing will continue so that the serialized data output from the block 218 will generally resemble the sequence shown in FIG. 8, with different portions of each block being successively transferred as generally discussed above. This stream is passed along path 220 to an ECC code insertion circuit 222, as well as to an ECC generation block 224.

The ECC generation block 224 operates to accumulate the data from path 220 and periodically generate and output corresponding ECC codes to the insertion circuit 222 in an on-the-fly manner. In some embodiments, separate ECC codes are concurrently generated for each of the different blocks A-D 190-196, so that the ECC codes for each sector are stored separately with the rest of the sector in the array 116. This allows sectors to be individually read (and decoded) from the array.

In other embodiments, the ECC codes are generated for groups of the interleaved data and stored in an appropriate location in the array. This latter approach provides certain efficiencies, but generally requires all of the associated sectors to be read from the array (even if only a single sector is returned to the host). Advantages and disadvantages are associated with each approach, and so a particular approach should be selected depending on the requirements of a given application.

The ECC generation block 224 can further be configured to generate multi-layer ECC protection, such as for both individual sectors (or portions thereof) as well as for larger interleaved groupings of the data. As noted above, the ECC codes generated by block 224 can take any number of forms, including Reed Solomon codes, Hamming codes, parity codes, etc. While not limiting, it is contemplated that in at least some embodiments the codes allow the identification of up to a selected number of errors in a readback sequence, and the correction of a selected number of said detected errors.

The resulting ECC codes generated by block 224 are provided to the insertion circuit 22 for insertion into the stream. The address of the codes within the stream is tracked by the address control block 216, which also supplies the requisite downstream signals to ensure the data are placed in the correct respective registers of registers block 212 and cells 124.

A defect management block 226 is also generally shown in FIG. 10. While any number of defect management configurations can be readily employed, in some embodiments a defect map 228 or other similar information is maintained to identify defective locations in the arrays 116. Such defects can identified during manufacturing or during subsequent field use, and respectively identify cells, rows and/or columns that have been deallocated from further use.

The defect map information can be arranged as a sequence of pointers to particular addresses; for example, in some embodiments up to a selected number of bad column pointers (BCPs) are maintained for each array identifying columns of cells not available for use. All of the defect management information can be retrieved and stored in local memory (e.g., RAM 108, FIG. 1) upon device initialization, or portions of the defect management information can be retrieved upon receipt of the input data from the host device.

The defect management block 226 monitors the addressing carried out by the addressing control block 216, and compares this to the defect information. When an address range selected by the addressing control block 216 includes a defect in the array, the defect management block 226 signals the serialization circuit 218 to temporarily delay the outputting of the associated sector data from the buffer 112 while an appropriate number of filler bits (such as an 8-bit byte) are transferred from the block 226 to the circuit 218 for insertion into the stream. The ECC generation circuit 224 is similarly notified so that the codes are not generated for the filler bits. In this way, the sector structure 180 (FIG. 1) "slips" a number of bits equal to the number of filler bits, so that the stored data encroaches into the "spare bytes provisioned for this purpose.

In other embodiments, the notification by the defect management block 226 of a defect allows the addressing control block to direct the associated data to be stored elsewhere. This can include the allocation of a different set of memory cells for that purpose, including in an area non-contiguous with the rest of the sector data. Since RSM cells can be individually selected and written to any desired logical value, no constraints are present that require writing to a particular group of cells along a common word line, pre-processing the cells such as via an erase operation to remove charge from a floating gate prior to writing, etc. Redundancy can also be utilized such that data in a particular array 116 (e.g., array 0 in FIG. 1) are mirrored in a second buddy array (e.g., array 1 in FIG. 1), and the data can be simultaneously or sequentially written to these respective arrays.

As desired, the circuitry in FIG. 10 can further generate and insert control data into the output stream using a control data generation block 230. Such control (overhead) data can be stored locally in the memory structure 180 (FIG. 7) in the array, or can be maintained in a separate location within the array. The control data may include data associated with the storage of the blocks A-D (or portions thereof) including the locations of filler bits, the locations of ECC codes, addressing for the various portions of the blocks, etc. Such control data can also be interleaved into the stream, or appended at the end with the generation of separate ECC codes therefor. It is contemplated that in at least some embodiments, the overhead data can be retrieved first upon receipt of a read command, and then used to control the servicing of the command.

FIG. 11 generally depicts a resulting interleaved stream of data generated by the circuitry of FIG. 10. Portions of addressable blocks of data from the buffer 112 are identified as "D," ECC codes are identified as "E," filler bits are identified as "F" and control blocks are identified as "C." It will be appreciated that FIG. 11 is merely illustrative in nature to present one way in which such data can be organized and transferred, so that FIG. 11 is neither drawn to scale nor is any limitation to be taken from the particular numbers or arrangements of the blocks. It will be further appreciated that the control data for a particular write operation can be accumulated for an entire session involving the writing of multiple numbers of sectors, after which a post-processing step takes place whereby the control data are transferred separately in a second stream to the array 116.

In some embodiments, the defect management data can be arranged in a centralized, selected location in the memory arrays 116 as generally depicted in FIG. 12. More specifically, addressing associated with various defective locations identified in the various arrays 116 can be arranged in a suitable format, with a particular defect list for each array (in this case, arrays 0-N). This data can be updated as new defects are discovered (such as during a read/verify operation). An upper limit on the number of acceptable defects can be established for a given section of the memory (e.g., in a particular array, etc.), after which the entire array is deallocated and the contents transferred to other available locations.

FIG. 13 provides a corresponding memory data arrangement for the arrays 116. In this embodiment, each array 116 is divided into a number of partitions (memory blocks or units), each comprising a boot region, a reserved region, a control data region, user data region and spare data region. The boot region can store information accessed upon initialization of the device 100, such as programming for the controller 102, pointers to other information such as the defect information, etc. This information can be separately read and merged (such as into the RAM 108, FIG. 1) to provide the overall boot information for the controller 102.

The reserved region can include operational information such as used to access various cells in the memory block (such as local $V_{REF}$ values, read/write parameters, etc.). The control data region can be advantageously used to store the control data discussed above. Other memory configurations can readily be utilized, so that the representation of FIG. 13 is merely for purposes of illustrating a particular embodiment. For example, in another embodiment the control data are stored with the user data, either as a portion of the sector structure (see e.g., FIG. 7), or in other suitable locations.

In some embodiments, the boot information in regions includes logical block address (LBA) information associated with the physical block addresses (PBAs) of each of the memory blocks. Upon receipt of a given host command to read or write data, the controller 102 can carry out an appropriate conversion to the corresponding physical address.

As indicated above, an advantage of the use of RSM cells 124 is that such cell constructions generally do not experience wear-out after repeated use, and therefore it is not necessary as in prior art devices to implement wear-leveling techniques whereby the use of data cells is distributed throughout the array. Nevertheless, in some embodiments transformations in the locations of stored data can be carried out as desired to avoid writing values to the same cells repeatedly.

Figure 14:
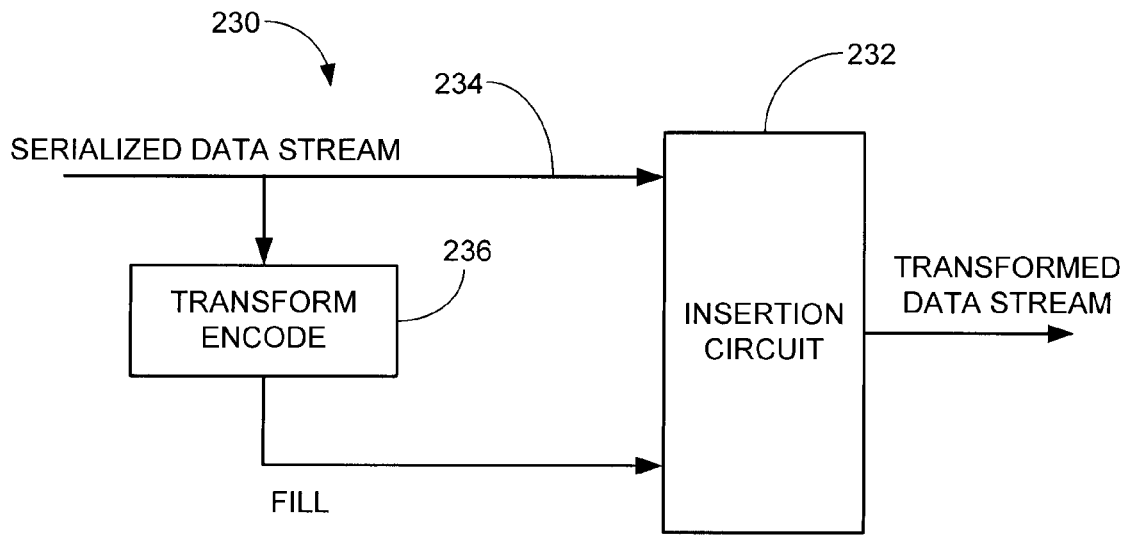
FIG. 14 generally illustrates a transform encoding operation.

FIG. 14 provides one embodiment in which a transformation encoder 230 provides transform (filler) bits for injection into the data stream generated by the circuitry of FIG. 10. Such transformations serve to shift the data by a selected value. Generally, the shifting value is 0, 1, . . . N for n-bit cells. The shifting value can be chosen randomly, or can follow a certain preselected or calculated pattern. In the embodiment of FIG. 14, an insertion circuit 232 receives the serialized stream on path 234. A transform block 236 outputs the appropriate number of transform bits which are then inserted into the stream by the circuit 232. When the data byte encoded by the transform bits is the first byte in the stream sequence, a first number of the bits can be used to record the shift value and the remaining bits, if any, can be fill bits. In some embodiments, the first byte in the received stream is used by downstream processing to track the presence and locations of the transform bits.

Figure 15:
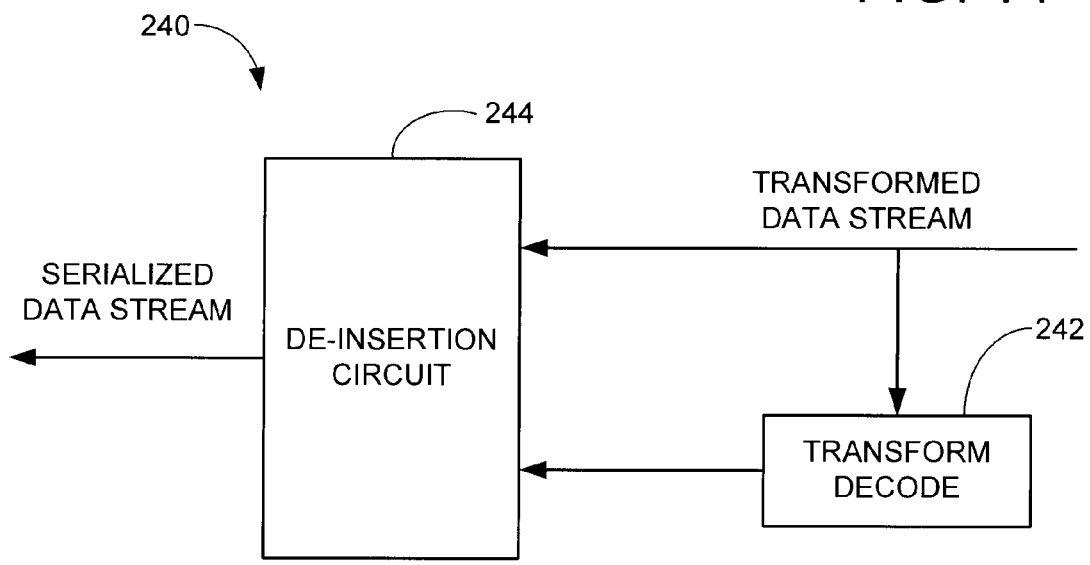
FIG. 15 generally illustrates a transform decoding operation.

A suitable transform decoder 240 is shown in FIG. 15. Upon subsequent read back of the data from the arrays 116, the first byte is read by a decode block 242, the number of shifted bits is decoded, and a suitable control signal is provided to a selection circuit 244 to remove the transformation shifting from the recovered data stream.

For purposes of the appended claims, the term "resistive sense memory (RSM) cell" and the like will be construed consistent with the foregoing discussion to describe a non-volatile memory cell with a construction in which different resistances are utilized to establish different storage states, such as but not limited to RRAM, MRAM and STRAM, and excludes structures that include a floating gate or similar structure that requires an erasing operation prior to use such as but not limited to EEPROM, flash, etc.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising:
   storing a plurality of addressable data blocks from a host device in a buffer;
   serially transferring at least a portion of each of the addressable data blocks to a separate register of a plurality of registers; and
   simultaneously writing the transferred portions of said addressable data blocks from the registers to non-volatile resistive sense memory (RSM) cells of a semiconductor memory array so that a storage state of a selected one of the RSM cells is changed from a high resistance state to a low resistance state and a storage state of another selected one of the RSM cells is changed from a low resistance state to a high resistance state.

2. The method of claim 1, wherein the plurality of addressable data blocks comprises a first addressable data block and a second addressable data block, wherein the plurality of registers comprises a first register and a second register, and wherein the serially transferring step comprises respectively transferring data from the first addressable data block to the first register and transferring data from the second addressable data block to the second register.

3. The method of claim 2, wherein the serially transferring step further comprises respectively transferring data from the second addressable data block to the first register and transferring data from the first addressable data block to the second register.

4. The method of claim 1, wherein the simultaneously writing step comprises overwriting said RSM cells of the semiconductor memory array with the contents of the respective registers irrespective of respective initial storage states of said RSM cells.

5. The method of claim 1, wherein the simultaneously writing step comprises reading said RSM memory cells to determine initial storage states thereof, and overwriting those RSM cells that have initial storage states that are different from the contents of the respective registers while not writing those RSM cells that have initial storage states that are the same as the contents of the respective registers.

6. The method of claim 5, wherein the simultaneously writing step further comprises carrying out an exclusive-or (XOR) comparison between the contents of the respective registers and the initial storage states of the RSM cells prior to the overwriting step.

7. The method of claim 1, wherein the serially transferring step comprises generating an interleaved data stream in which data from a first addressable data block in the buffer are interleaved with data from a second addressable data block in the buffer.

8. The method of claim 7, wherein the interleaved data stream further comprises control data associated with the plurality of addressable data blocks.

9. The method of claim 7, wherein the interleaved data stream further comprises error correction codes (ECC) associated with the plurality of addressable data blocks.

10. The method of claim 1, further comprising a step of generating control data associated with the plurality of addressable data blocks, and storing the control data in a separate location in the semiconductor memory array.

11. The method of claim 1, further comprising identifying a defect in the semiconductor memory array comprising at least one of the RSM cells associated with the plurality of addressable data blocks, and wherein the serially transferring step comprises inserting at least one filler bit into an interleaved data stream to compensate for said defect.

12. The method of claim 1, wherein each of the RSM cells is characterized as a spin-torque transfer random access memory (STRAM) memory cell.

13. An apparatus comprising:
a semiconductor memory array comprising a plurality of non-volatile resistive sense memory (RSM) cells;
a buffer configured to store a plurality of addressable data blocks from a host device; and
a controller configured to serially transfer at least a portion of each of the addressable data blocks to a separate register of a plurality of registers by generating an interleaved data stream in which data from a first addressable data block in the buffer are interleaved with data from a second addressable data block in the buffer, and to simultaneously write the transferred portions of said addressable data blocks from the registers to corresponding RSM cells of said array.

14. The apparatus of claim 13, wherein the controller overwrites said RSM cells of the semiconductor memory array with the contents of the respective registers irrespective of respective initial storage states of said RSM cells.

15. The apparatus of claim 13, wherein the simultaneously writing of the controller comprises changing a storage state of a selected one of the RSM cells from a high resistance state to a low resistance state while simultaneously changing a storage state of another selected one of the RSM cells from a low resistance state to a high resistance state.

16. The apparatus of claim 13, wherein the controller further inserts at least a selected one of control data or error correction codes (ECC) associated with the plurality of addressable data blocks into said interleaved data stream.

17. The apparatus of claim 13, wherein each of the RSM cells is characterized as a spin-torque transfer random access memory (STRAM) memory cell.

18. A method comprising:
receiving a plurality of addressable data blocks from a host device;
interleaving a plurality of addressable data blocks received from a host device to form an interleaved stream;
inserting at least one filler bit into said interleaved stream responsive to a detected defect in a semiconductor memory array comprising a plurality of resistive sense memory (RSM) cells; and
storing the interleaved stream to said RSM cells.

19. The method of claim 18, in which the storing step comprises changing a storage state of a selected one of the RSM cells from a high resistance state to a low resistance state while simultaneously changing a storage state of another selected one of the RSM cells from a low resistance state to a high resistance state.

20. The method of claim 18, in which the plurality of received addressable data blocks are stored in a buffer, and the interleaved stream is stored in a plurality of registers.

* * * * *